US012309984B2

(12) United States Patent
Koh et al.

(10) Patent No.: US 12,309,984 B2
(45) Date of Patent: May 20, 2025

(54) RADIATION SHIELD AND GROOVE IN SUPPORT STRUCTURE

(71) Applicant: Intel Corporation, Santa Clara, CA (US)

(72) Inventors: Boon Ping Koh, Penang (MY); Twan Sing Loo, Penang (MY); Yew San Lim, Penang (MY); Tin Poay Chuah, Penang (MY)

(73) Assignee: Intel Corporation, Santa Clara, CA (US)

( * ) Notice: Subject to any disclaimer, the term of this patent is extended or adjusted under 35 U.S.C. 154(b) by 739 days.

(21) Appl. No.: 17/471,396

(22) Filed: Sep. 10, 2021

(65) Prior Publication Data
US 2021/0410341 A1    Dec. 30, 2021

(51) Int. Cl.
*H05K 9/00*    (2006.01)
*H05K 1/02*    (2006.01)

(52) U.S. Cl.
CPC ......... *H05K 9/0024* (2013.01); *H05K 1/0224* (2013.01)

(58) Field of Classification Search
CPC ................................................... H05K 9/0028
See application file for complete search history.

(56) References Cited

U.S. PATENT DOCUMENTS

| 6,462,436 B1* | 10/2002 | Kay ........................ H04B 15/02 |
| | | 361/818 |
| 2004/0240191 A1* | 12/2004 | Arnold .................. H01L 23/315 |
| | | 257/E23.079 |
| 2014/0334119 A1* | 11/2014 | Ho ........................ H05K 9/0039 |
| | | 361/753 |
| 2021/0274692 A1* | 9/2021 | Chang .................... H05K 1/111 |
| 2022/0029361 A1* | 1/2022 | Braun ................ H01R 12/7064 |

* cited by examiner

*Primary Examiner* — Hung V Ngo
(74) *Attorney, Agent, or Firm* — Banner & Witcoff Ltd.

(57) ABSTRACT

Particular embodiments described herein provide for an electronic device that can be configured to include a support structure that includes a radiation shield groove that extends past a surface of the support structure and into the support structure, a radiation source on the substrate, and a radiation shield around the radiation source, where the radiation shield includes a wall secured to the support structure and a groove channel coupling wall that extends past a surface of the support structure and into the radiation shield groove.

19 Claims, 12 Drawing Sheets

RADIATION SHIELD AND GROOVE IN SUPPORT STRUCTURE

TECHNICAL FIELD

This disclosure relates in general to the field of computing, and more particularly, to a radiation shield and a groove in a support structure.

BACKGROUND

Emerging trends in systems place increasing performance demands on the system. One way to attempt to improve performance and function is to increase the density of the devices and systems and pack more computing elements into the devices and systems. The increasing performance demands can create a relatively crowded system as more and more components are located in close proximity to each and can cause radiating noise level increases in the system. More specifically, the increase in computing elements often causes elevated noise levels in systems. Electromagnetic interference (EMI) and radio-frequency interference (RFI) affect almost every electronic device, especially mobile compute devices. In addition, some electrical components are both a source of electromagnetic and radio-frequency radiation and are susceptible to EMI/RFI from adjacent sources. The radiating noise level can cause a reduction in device performance, a reduction in the lifetime of a device, and/or delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
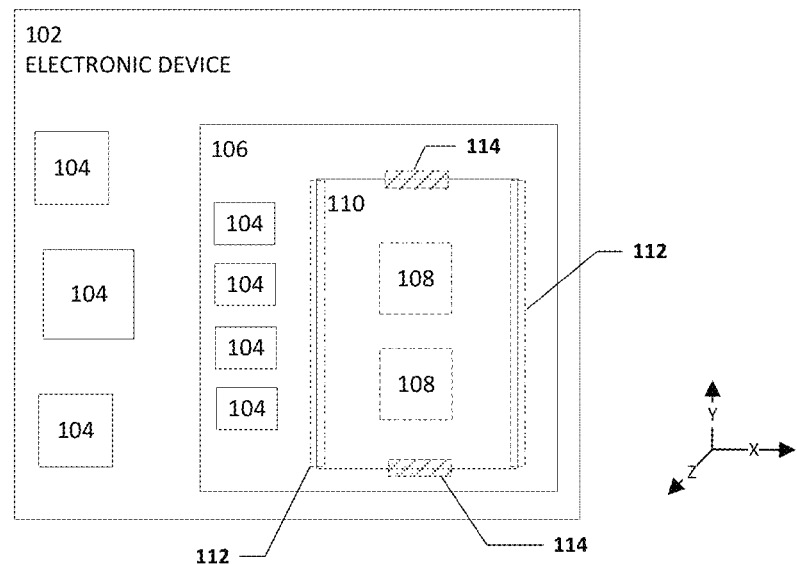
FIG. 1 is a simplified block diagram of a system to enable a radiation shield and a groove in a support structure, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a radiation shield and a groove in a support structure. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example. The term "about" indicates a tolerance of twenty percent (20%). For example, about one (1) millimeter (mm) would include one (1) mm and ±0.2 mm from one (1) mm. Similarly, terms indicating orientation of various elements, for example, "coplanar," "perpendicular," "orthogonal," "parallel," or any other angle between the elements generally refer to being within +/−5-20% of a target value based on the context of a particular value as described herein or as known in the art.

FIG. 1 is a simplified block diagram of an electronic device configured with a radiation shield and a groove in a support structure, in accordance with an embodiment of the present disclosure. In an example, an electronic device can include one or more radiation shields and grooves in a support structure. For example, as illustrated in FIG. 1, an electronic device 102 includes one or more electronics 104 and a support structure 106. The support structure 106 can include at least one of the one or more electronics 104, one or more radiation sources 108, a radiation shield 110, one or more radiation shield grooves 112, and one or more clips 114.

In an example, the support structure 106 can be a substrate and more particularly, a printed circuit board (PCB). The one or more radiation sources 108 can be on or over the support structure 106 and the radiation shield 110 can be over the one or more radiation sources 108. At least one wall of the radiation shield 110 can extend into the radiation shield groove 112 in the support structure 106 and help couple the radiation shield 110 to the radiation shield groove 112. The radiation shield groove 112 can be coupled to a ground plane (not shown) and can help ground the radiation shield 110 when the radiation shield 110 is coupled to the radiation shield groove 112. In addition, when the radiation shield 110 is coupled to the radiation shield groove 112, the radiation shield groove 112 can help support and stabilize the radiation shield 110 in the X plane and in the Y plane. Further, at least one edge of the radiation shield 110 can be coupled to the one or more clips 114. The one or more clips 114 can help support and stabilize the radiation shield 110 in the Z plane and in the Y plane. The term "X plane," refers to the plane along the "X" axis of an (x, y, z) coordinate axis or cartesian coordinate system, the term "Y plane," refers to the plane along the "Y" axis of the (x, y, z) coordinate axis or cartesian coordinate system, and the term "Z plane," refers to the plane along the "Z" axis of the (x, y, z) coordinate axis or cartesian coordinate system.

In an example, the radiation shield 110 is comprised of a conducive material and can include stainless steel, copper, an alloy such as nickel copper, or some material that is conductive, rigid, and can help contain or mitigate the radiation from the one or more radiation sources 108 from extending past the radiation shield 110 or at least partially contain or mitigate the radiation from the one or more radiation sources 108 from extending past the radiation shield 110. The radiation may be electromagnetic radiation, internal and external Wi-Fi and cellular radio-frequency radiation, high speed input/output (I/O) trace/connector digital noise radiation, switching voltage regulator radiation, or some other type of radiation that can have an undesirable effect on one or more components of an electronic device. For example, electromagnetic interference (EMI) and radio-frequency interference (RFI) affect almost every electronic device, especially mobile compute devices. System on a chip (SoC) packages are both a source of electromagnetic radiation and radio-frequency radiation and are susceptible to EMI/RFI from adjacent sources. For example, when a smartphone is placed on or near a keyboard of a laptop, performance of the laptop is often impacted (e.g., laptop screen flicker, CPU hang, reboot of the system, etc.). The term "radiation" includes electromagnetic radiation, radio-frequency radiation, and other similar radiation that can cause an undesirable effect on one or more components of an electronic device.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. One way to increase performance and function is to increase the density of the devices and systems and pack more computing elements into the devices and systems. However, the increase in computing elements causes an increase in the EMI and RFI. EMI and RFI affect almost every electronic device, especially mobile compute devices. In addition, SoC packages are both a source of electromagnetic and radio-frequency radiation and are susceptible to EMI/RFI from adjacent sources.

Die and package radiation have been identified as RFI risk factors. In addition, radio frequency signals from internal radios and external smartphones in proximity to personal computers have interfered with the SoCs and caused basic functionality issues, including display flickering and system hang/reboot. Some SoC designs introduce disaggregation and multichip package (MCP) using an embedded multi-die interconnect bridge (EMIB) which can increase both RFI and immunity risk. Also, scalable package-level shielding techniques (simultaneously shielding both the package and the dies) are required for some Internet of Things (IoT) devices, data centers, SoCs, and seven (7)/ten (10) nm disaggregated systems.

In some systems, the package layer-count increases to provide a package surface shielding with a ground layer at the expense of package cost and system Z height. However, the package surface shielding can be insufficient because of multiple-die radiation. In addition, package surface shielding with an additional ground layer reduces radio frequency noise radiation/coupling but at the expense of package cost and Z height increases. In other systems, a conductive coating may be used. However, a conductive coating, such as metal sputtering, is considered to be prohibitively-expensive and is an uncertified manufacturing process for SoC applications and high-volume manufacturing.

In some systems, an on-board shield may be used to implement a Faraday cage with a motherboard and PCB ground contacts. While on-board shielding is relatively common, it requires good ground stitching between the Faraday cage and motherboard and PCB ground contacts. In general, about 2.5 to about five (5) mm ground stitching space (about $\lambda/20$ to about $\lambda/10$) is required to provide good shielding effectiveness up to about five (5) to about six (6) GHz WiFi channels. This requirement is almost impossible to meet for Type-3 PCBs and for compact size shielding solutions, especially for SoCs with high-density interconnects. Increasing the size of shielding for its placement around less dense PCB areas can cause mechanical warp, height increase, and thermal contact issues. The shielding effectiveness significantly relies on PCB designs and technologies (e.g., Type-3 PCB vs. Type-4 PCB) and the on-board shielding solutions are applicable only for Type-4 PCBs, which are higher in cost than Type-3 and are used only for a small number of premium PCs. High volume PCs are designed with Type-3 PCBs.

With some current radiation shields, there are typically technical problems or challenges that often encountered. For example, conventional radiation shields designs are often unable to resolve the effectiveness of shielding and meet the cost target. For example, in some current radiation shields, there can be a relatively high cost associated with the process to tightly hold and secure the radiation shield to the PCB. To reduce the cost, sometimes a thin shield frame design is used but EMI/RF leakage can occur due to thin shield frame designs.

In addition, a relatively high cost is typically associated with most two-piece metal radiation shields (lid and frame) and surface mount technology issues can arise due to frame warpage. Also, some radiation shields with a lid and clip design have a reduced shied effectiveness due to the seam or gap in between the clips where the radiation shield does not make contact with the PCB. In addition, with some lid and clip designs, damage to the radiation shield can cause high downtime for repairing due to the many clips causing low serviceability, especially if one or more of the clips needs to be replaced. What is needed is a radiation shield that can be coupled to a substrate without creating a relatively large number of gaps (e.g., the gaps between clips).

A radiation shield, as outlined in FIG. 1, can resolve these issues (and others). In an example, a radiation shield (e.g., the radiation shield 110) can be coupled to a groove (e.g., the radiation shield groove 112) in a support structure (e.g., support structure 106). The groove can be connected to a ground plane to help provide a path for grounding contact for the radiation shield. Clips can help secure the radiation shield in the Z plane and in the Y plane (or the X plane depending on the orientation of the radiation shield and clips). The radiation shield can extend into the groove in the support structure to help provide a seamless (no gap) connection between the radiation shield and the support structure. The seamless (no gap) connection between the radiation shield and the support structure helps to provide a shield against the effects of electromagnetic waves. When coupled with the groove in the support structure, the radiation shield can provide attenuations of 80 dB for a lower frequency of 2.45 GHz and at least 30 dB attenuation for a higher frequency of 6.5 GHz.

Also, the radiation shield can extend into the groove in the support structure to help absorb warpage of the radiation shield and can allow for a larger tolerance of shield frame warpage as compared to some current radiation shields. The serviceability of the radiation shield (e.g., for shield replacement, lid exchange, etc.) can be relatively easy and fast as compared to some current radiation shields where the radiation shield is secured to a PCB using solder. In addition, a relatively small number of clips (e.g., two or four) can be used when compared with current designs that typically use more than four (4) clips.

In an example, the radiation shield can extend into the groove and a locking mechanism can be created to help secure the radiation shield to the support structure. More specifically, an edge of the radiation shield that extends into the groove can include a latch profile that includes an angle-out sidewall. When the radiation shield is inserted into the groove, the angle-out sidewall can be turned into an angle-in sidewall in the groove to help secure the radiation shield to the support structure. One or more clips can help secure the radiation shield to the support structure and help reduce and/or restrict movement of the radiation shield in the Z direction or Z plane and movement in the Y direction or Y plane (or the X direction or X plane depending on the orientation of the radiation shield and clips). In an example, four (4) clips are used to help secure the radiation shield to the support structure. In another example, two (2) clips re used to help secure the radiation shield to the support structure.

Figure 2:
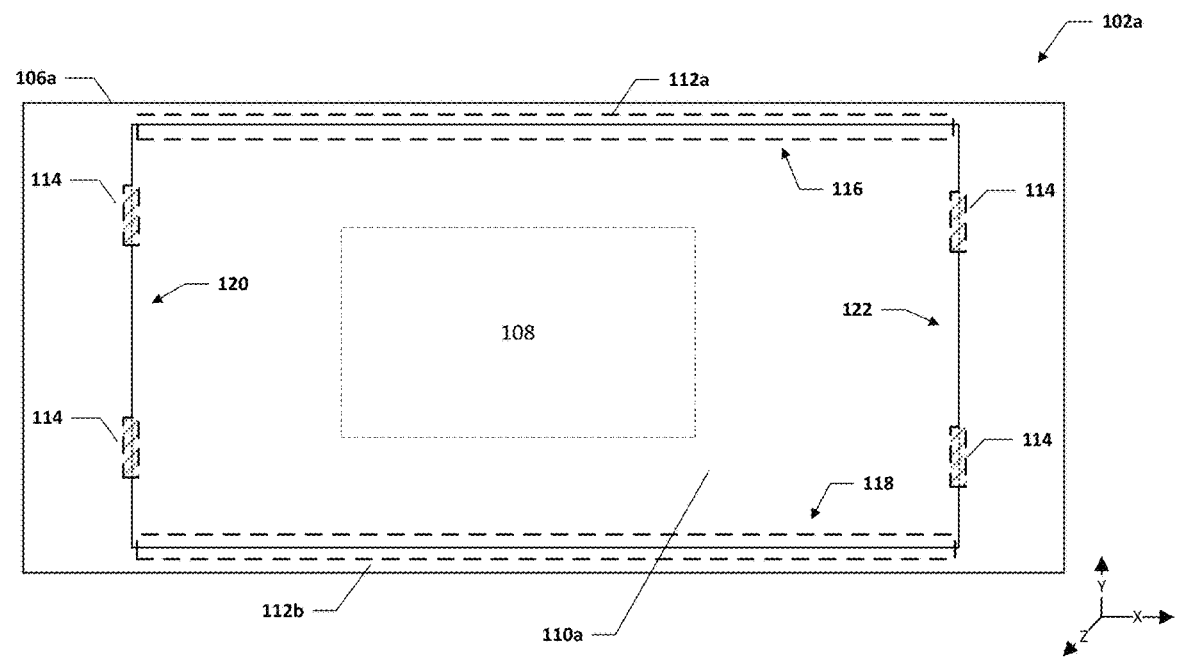
FIG. 2 is a simplified block diagram of a portion of a system to enable a radiation shield and a groove in a support structure, in accordance with an embodiment of the present disclosure.

Turning to FIG. 2, FIG. 2 is a simplified block diagram of a side cut away view of a portion of an electronic device 102a, in accordance with an embodiment of the present disclosure. In an example, the electronic device 102a can include a support structure 106a, the radiation source 108, a radiation shield 110a, and one or more clips 114. In some examples, the support structure 106a can be a PCB. The support structure 106a can include one or more radiation shield grooves 112.

As illustrated in FIG. 2, a first side 116 of the radiation shield 110a can be coupled with a first radiation shield groove 112a in the support structure 106a and a second side 118 of the radiation shield 110a can be coupled with a second radiation shield groove 112b in the support structure 106a. The first side 116 of the radiation shield 110a can be opposite of the second side 118 of the radiation shield 110a. A third side 120 of the radiation shield 110a and a fourth side 122 of the radiation shield 110a can be coupled to the support structure 106a using clips 114. The third side 120 of the radiation shield 110a can be opposite of the fourth side 122 of the radiation shield 110a. While FIG. 2 is showing the third side 120 and the fourth side 122 being coupled to the support structure 106a using two clips 114, one or more clips 114 may be used depending on design constraints. In an example, four (4) clips are used to help secure the radiation shield to the support structure. In another example, two (2) clips re used to help secure the radiation shield to the support structure.

Figure 3:
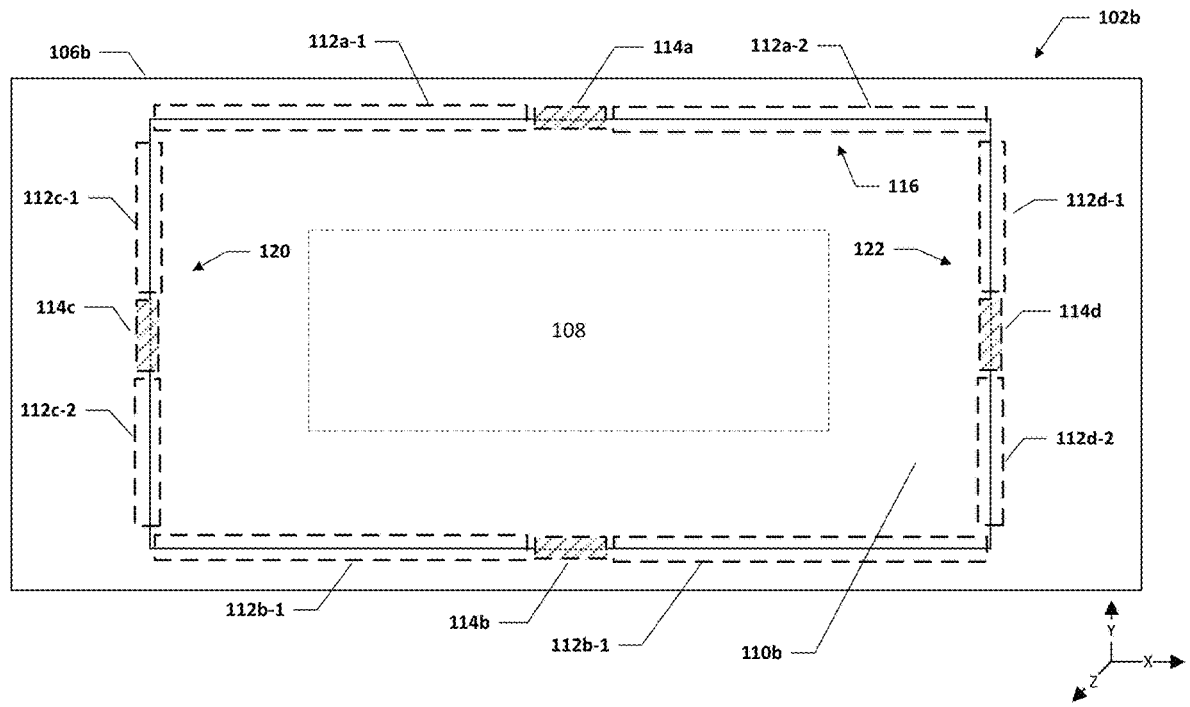
FIG. 3 is a simplified block diagram of a portion of a system to enable a radiation shield and a groove in a support structure, in accordance with an embodiment of the present disclosure.

Turning to FIG. 3, FIG. 3 is a simplified block diagram of a side cut away view of a portion of an electronic device 102b, in accordance with an embodiment of the present disclosure. In an example, the electronic device 102b can include a support structure 106b, the radiation source 108, a radiation shield 110b, and the one or more clips 114. In some examples, the support structure 106b can be a PCB. The support structure 106b can include the one or more radiation shield grooves 112.

As illustrated in FIG. 3, the first side 116 of the radiation shield 110b can be coupled with the first radiation shield groove 112a in the support structure 106b and a first clip 114a. As illustrated in FIG. 3, the first radiation shield groove 112a may not be continuous and can be split by the first clip 114a so that a portion 112a-1 of the first radiation shield groove 112a is on one side of the first clip 114a and a portion 112a-2 of the first radiation shield groove 112a is on the other opposite side of the first clip 114a. Also, the second side 118 of the radiation shield 110b can be coupled with the second radiation shield groove 112b in the support structure 106b and a second clip 114b. As illustrated in FIG. 3, the second radiation shield groove 112b may not be continuous and can be split by the second clip 114b so that a portion 112b-1 of the second radiation shield groove 112b is on one side of the second clip 114b and a portion 112b-2 of the second radiation shield groove 112b is on the other opposite side of the second clip 114b. In addition, the third side 120 of the radiation shield 110b can be coupled with a third radiation shield groove 112c in the support structure 106b and a third clip 114c. As illustrated in FIG. 3, the third radiation shield groove 112c may not be continuous and can be split by the third clip 114c so that a portion 112c-1 of the third radiation shield groove 112c is on one side of the third clip 114c and a portion 112c-2 of the third radiation shield groove 112c is on the other opposite side of the third clip 114c. Further, the fourth side 122 of the radiation shield 110b can be coupled with a fourth radiation shield groove 112d in the support structure 106b and a fourth clip 114d. As illustrated in FIG. 3, the fourth radiation shield groove 112d may not be continuous and can be split by the fourth clip 114d so that a portion 112d-1 of the fourth radiation shield groove 122d is on one side of the fourth clip 114d and a portion 112d-2 of the fourth radiation shield groove 112d is on the other opposite side of the fourth clip 114d.

Figure 4:
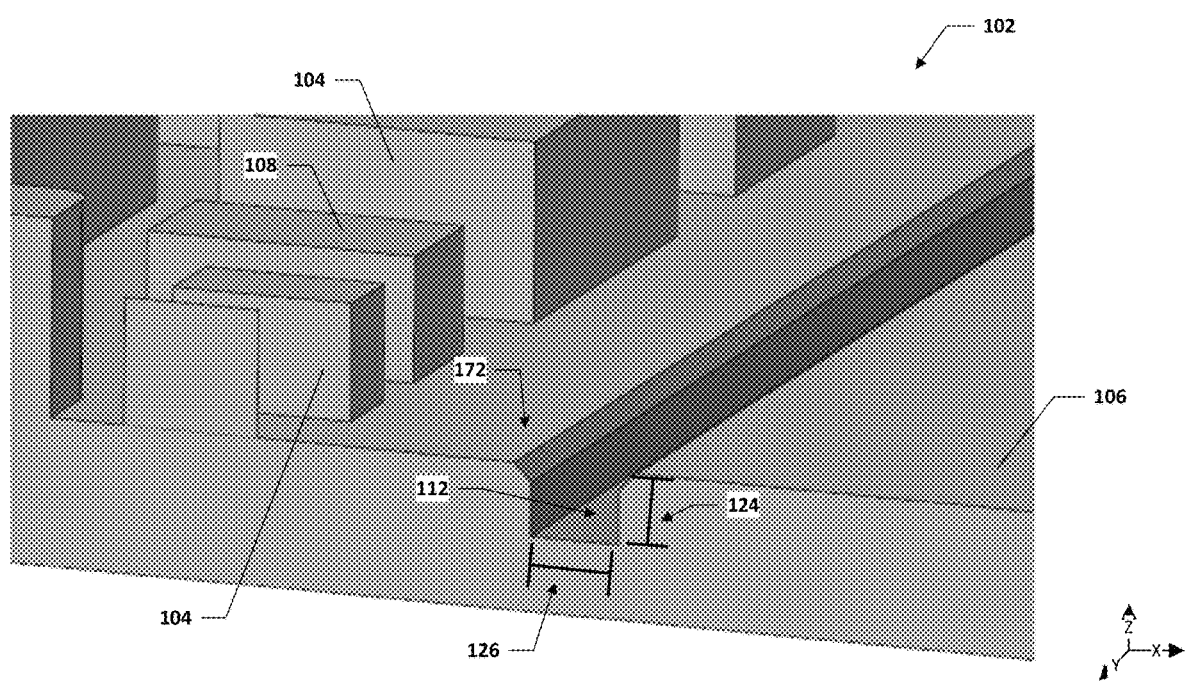
FIG. 4 is a simplified perspective view of a portion of a system to enable a radiation shield and a groove in a support structure, in accordance with an embodiment of the present disclosure.

Turning to FIG. 4, FIG. 4 is a simplified block diagram of a perspective cut away view of a portion of the electronic device 102. The electronic device 102 can include the one or more electronics 104, the one or more radiation sources 108, and the support structure 106. The one or more electronics 104 and the one or more radiation sources 108 can be on the support structure 106. The support structure 106 can include the one or more radiation shield grooves 112.

The one or more radiation shield grooves 112 can have a groove height 124 and a groove width 126. The groove height 124 of each of the one or more radiation shield grooves 112 is the distance a specific radiation shield groove 112 extends into the support structure 106 from a surface 172 of the support structure 106. The groove height 124 depends on the thickness of the support structure 106 and design constraints. In a specific example, the groove height 124 of the radiation shield groove 112 can be about 0.4 mm or more from the surface 172 of the support structure 106 (e.g., the surface of the support structure 106 that includes the radiation source 108), depending on the thickness of the support structure 106 and design constraints. In another specific example, the groove height 124 of the radiation shield groove 112 can be between about 3.5 mm and about 0.3 mm from the surface 172 of the support structure 106 and ranges therein (e.g., between about 0.8 mm and about 0.4 mm, or between about 1 mm and about 0.5 mm), depending on the thickness of the support structure 106 and design constraints. In some examples, the groove height 124 is less than about half of the thickness of the support structure (e.g., less than about 0.785 mm for a 1.57 mm thick PCB). Each of the one or more radiation shield grooves 112 can have the same or similar groove height 124 or one or more of the one or more radiation shield grooves 112 may have a different groove height 124.

The groove width 126 of each of the one or more radiation shield grooves 112 is the distance between relatively parallel sides of the radiation shield groove 112 that extend into the support structure 106. The groove width 126 depends on a thickness of walls the radiation shield 110 (not shown), and/or design constraints. In a specific example, the groove width 126 of the radiation shield groove 112 can be between about 2 mm and about 0.4 mm and ranges therein (e.g., between about 1.5 mm and about 0.5 mm, or between about 1.75 mm and about 1 mm), depending on the thickness of walls the radiation shield 110 (not shown), and/or design constraints. Each of the one or more radiation shield grooves 112 can have the same or similar groove width 126 or one or more of the one or more radiation shield grooves 112 may have a different groove width 126.

Figure 5:
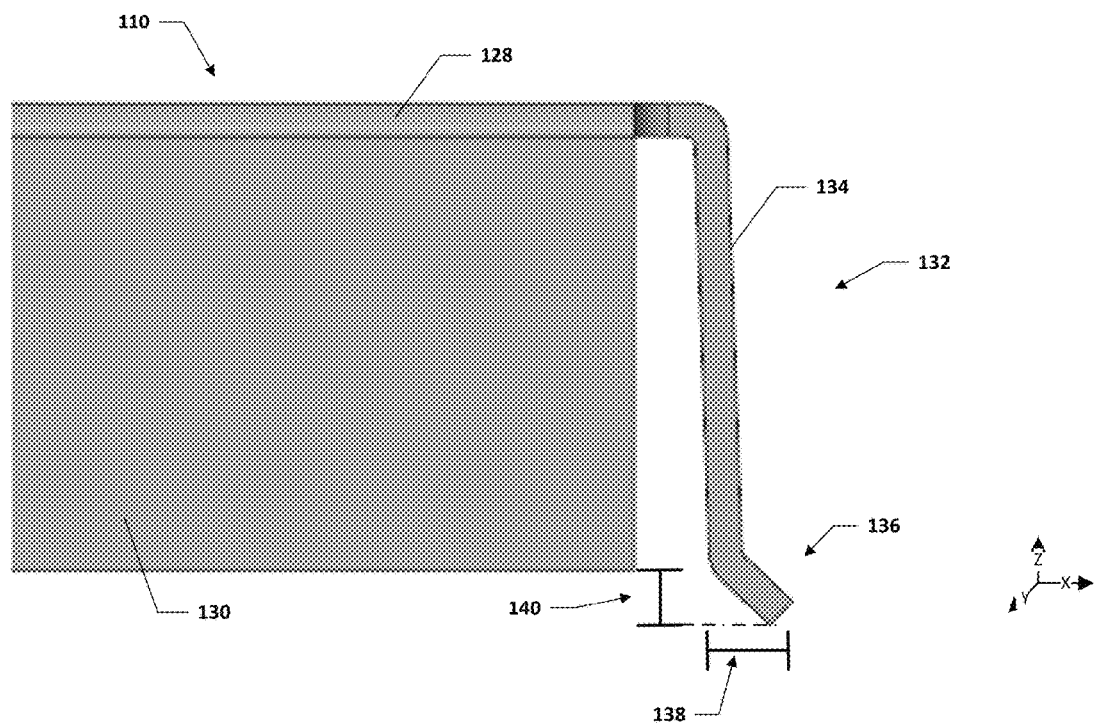
FIG. 5 is a simplified block diagram of a cut away side view of a portion of a system to enable a radiation shield and a groove in a support structure, in accordance with an embodiment of the present disclosure.

Turning to FIG. 5, FIG. 5 is a simplified block diagram side view of the radiation shield 110. The radiation shield 110 can include a lid 128, a wall 130, and a groove coupling wall 132. In an example, the lid 128, the wall 130, and the groove coupling wall 132 are not separate elements but portions of a single material that is constructed (e.g., bent) to create the lid 128, the wall 130, and the groove coupling wall 132. In another example, one or more of the lid 128, the wall 130, and the groove coupling wall 132 are joined together (e.g., solder, adhesive, tape, etc.) to create the radiation shield 110.

The groove coupling wall 132 can include a wall portion 134 and a groove coupling portion 136. The groove coupling portion 136 can have a width 138 and a length 140 that extends past an edge of the wall 130. The width 138 of the groove coupling portion 136 depends on the groove width 126 illustrated in FIG. 4 and, as explained below with reference to FIG. 7, the distance needed to help the radiation shield 110 coupled with the radiation shield groove 112 (illustrated in FIG. 4). The length 140 of the groove coupling portion 136 depends on the groove height 124 illustrated in FIG. 4 and the distance the groove coupling portion 136 of the radiation shield 110 will extend into the radiation shield groove 112 (illustrated in FIG. 4).

Figure 6:
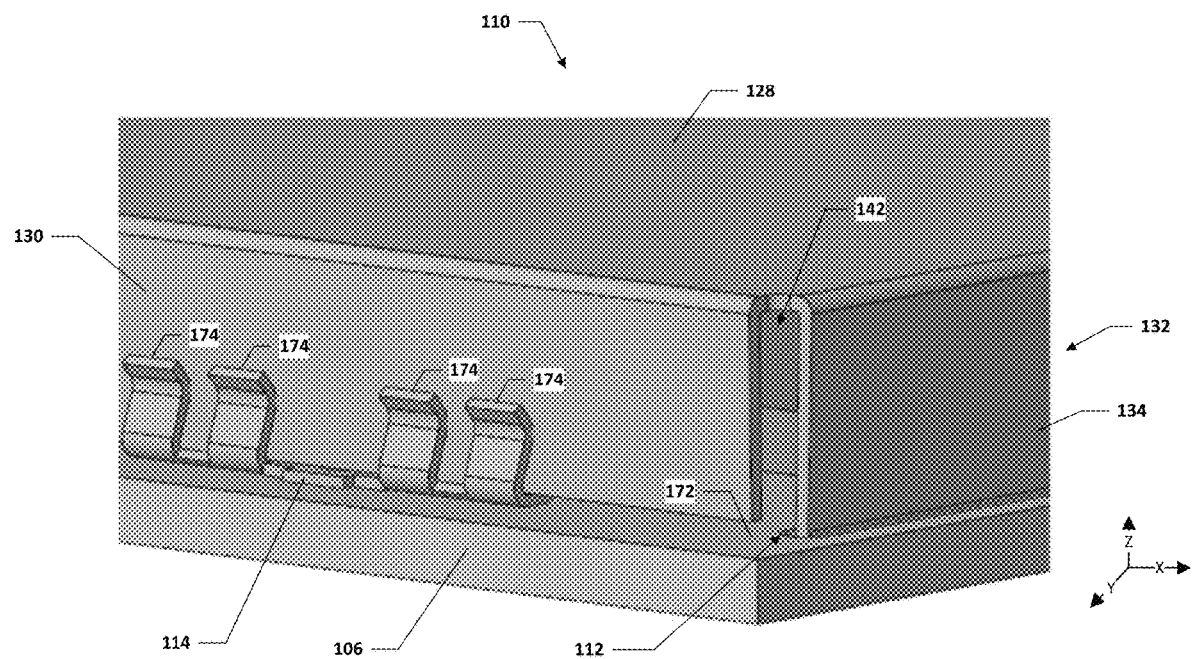
FIG. 6 is a simplified perspective view of a portion of a system to enable a radiation shield and a groove in a support structure, in accordance with an embodiment of the present disclosure.

Turning to FIG. 6, FIG. 6 is a simplified block diagram of a perspective view of the radiation shield 110 coupled to the support structure 106. The support structure 106 can include one or more clips 114 and the radiation shield groove 112. The radiation shield groove 112 can extend into the support structure 106 and past the surface 172 of the support structure 106. The radiation shield 110 can include the lid 128, the wall 130, and the groove coupling wall 132. The groove coupling wall 132 can include the wall portion 134 and the groove coupling portion 136 (not shown or referenced in FIG. 6 as it is in the radiation shield groove 112).

The wall 130 of the radiation shield 110 can be removably coupled to the one or more clips 114. Each of the one or more clips 114 can include one or more securing tabs 174 to help secure the wall 130 to a specific clip 114. For example, as illustrated in FIG. 6, the securing clip 114 is illustrated as having four (4) securing tabs 174. Each clip 114 can include one (1) or more securing tabs 174 depending on design constrains. The one or more clips 114 can removable secure the radiation shield 110 to the support structure 106 and help secure the radiation shield 110 in the Z plane and the Y plane (or the X plane depending on the orientation of the radiation shield 110 and the one or more clips 114). The groove coupling portion 136 of the groove coupling wall 132 can extend into and couple with the radiation shield groove 112 and help secure the radiation shield 110 in the X plane and the Y plane. The radiation shield groove 112 can be connected to a ground plane to help ground the radiation shield 110. The lid 128, the wall 130, and wall portion 134 of the groove coupling wall 132 define the structure of the radiation shield 110 and create a hollow interior where a radiation source (e.g., the radiation source 108) can be located. The structure of the radiation shield 110 can help contain the radiation from the radiation source.

In some examples, if the radiation shield 110 is created from a solid piece of material, the radiation shield 110 can also include a corner notch 142 to accommodate the bending of the material to create the wall 130 and the groove coupling wall 132. If the corner notch 142 is present, the gap created by the corner notch 142 can be small enough to block or at least substantially block radiation. For example, if the radiation is EMI radiation, the corner notch 142 can have a height and width that will block the EMI radiation or at least block a majority of the EMI radiation. In an illustrative example, if the radiation is EMI radiation, the height of the corner notch 142 can be less than about 2.5 mm and the width of the corner notch 142 can be less than about 2.5 mm to block the EMI radiation or at least block a majority of the EMI radiation. In a specific example if the radiation is EMI radiation, the corner notch 142 can have a height less than about 2 mm and width less than about 2 mm.

Figure 7:
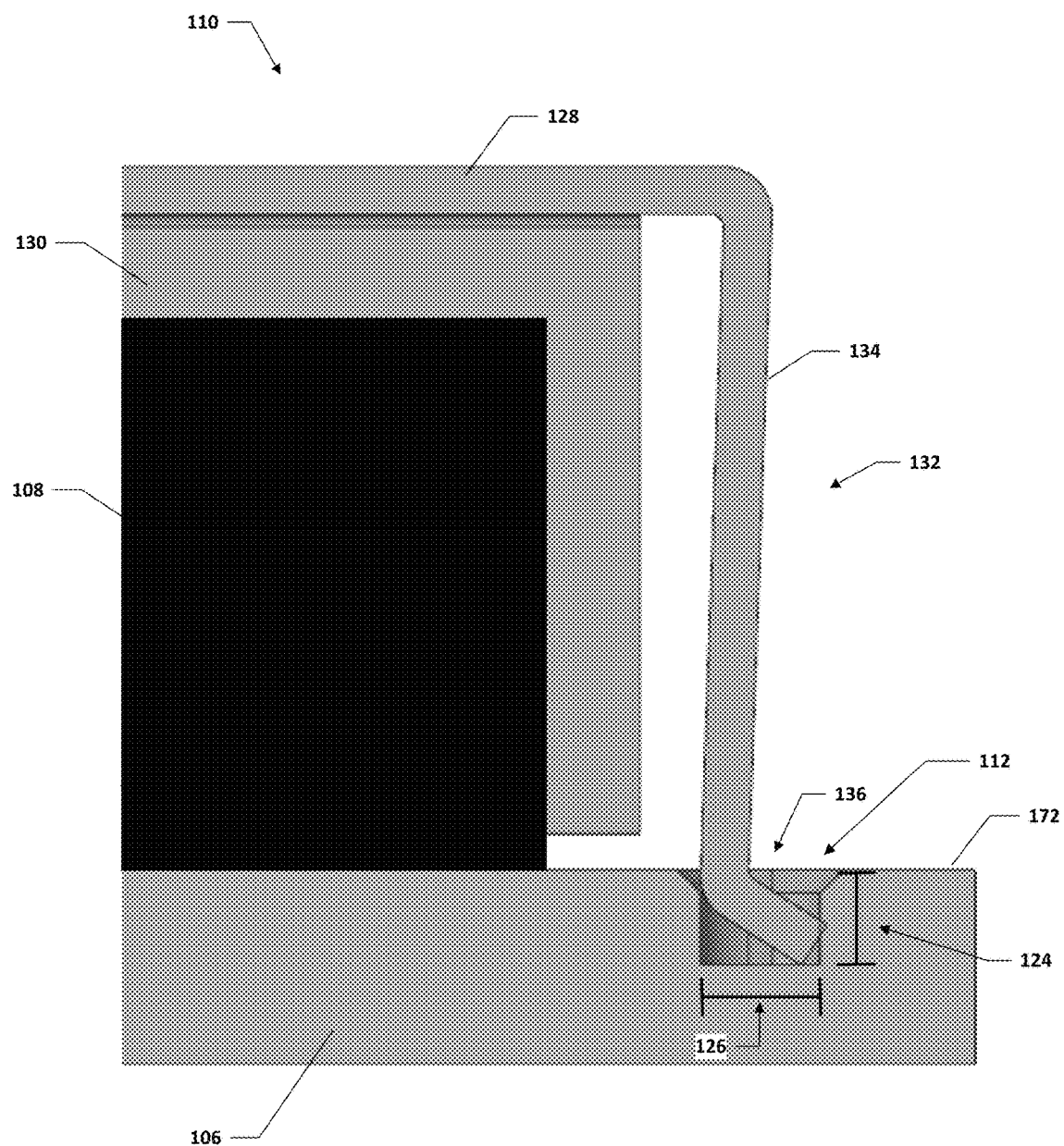
FIG. 7 is a simplified block diagram of a side cut away view of a portion of a system to enable a radiation shield and a groove in a support structure, in accordance with an embodiment of the present disclosure.

Turning to FIG. 7, FIG. 7 is a simplified block diagram of a cut away view of the radiation shield 110 coupled to the support structure 106. The support structure 106 can include the radiation source 108 and the radiation shield groove 112. The radiation shield groove 112 can extend into the support structure 106 and past the surface 172 of the support structure 106. The radiation shield groove 112 has the groove width 126 and the groove height 124. The groove height 124 is the distance the radiation shield groove 112 extends into the support structure 106 from the surface 172 of the support structure. The radiation shield 110 can include the lid 128, the wall 130 (illustrated as behind the radiation source 108), and the groove coupling wall 132. The groove coupling wall 132 can include the wall portion 134 and the groove coupling portion 136.

The groove coupling portion 136 of the groove coupling wall 132 can extend into and couple with the radiation shield groove 112. In an example, before the groove coupling portion 136 is coupled to the radiation shield groove 112, the wall portion 134 of the groove coupling wall 132 may be angled away from the radiation shield 110 (e.g., as illustrated in FIG. 5). After the groove coupling portion 136 is coupled to the radiation shield groove 112, the wall portion 134 of the groove coupling wall 132 is forced to angle in or towards the radiation shield 110 to create tension and a force that pushes the groove coupling portion 136 against one or more edges of the radiation shield groove 112 to help secure the radiation shield 110 in the X plane and the Y plane. The width 138 (illustrated in FIG. 5) of the groove coupling portion 136 depends on the groove width 126 and the distance needed to help the radiation shield 110 coupled with the radiation shield groove 112. The radiation shield groove 112 can be connected to a ground plane to help ground the radiation shield 110. The lid 128, the wall 130, and the wall portion 134 of the groove coupling wall 132 define the structure of the radiation shield 110 and create a hollow interior where the radiation source 108 is located. The structure of the radiation shield 110 can help contain the radiation from the radiation source 108.

Figure 8A:
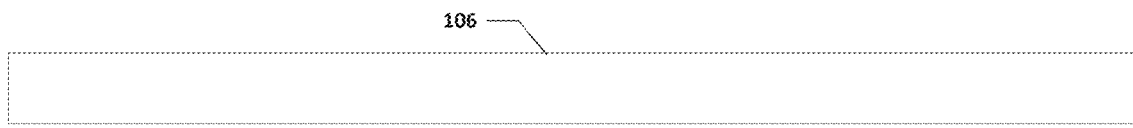
FIGS. 8A-8D are simplified block diagrams illustrating example details of the creation of a radiation shield groove in a portion of a system to enable a radiation shield and a groove in a support structure, in accordance with an embodiment of the present disclosure.

Turning to FIG. 8A, FIG. 8A is a simplified block diagram of the early stages of the formation of the radiation shield groove 112 in the support structure 106. In an example, the support structure 106 may be a substrate. More specifically, support structure 106 may be a PCB with traces (not shown) and a ground plane.

Figure 8B:
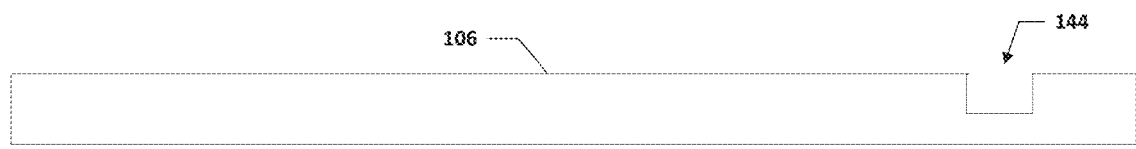

Turning to FIG. 8B, FIG. 8B is a simplified block diagram of the early stages of the formation of the radiation shield groove 112 in the support structure 106. In an example, a groove 144 can be created in the support structure 106. The groove 144 can be created using a router (e.g., a controlled depth router), etching, or some other means that can be used to create the radiation shield groove 112 in the support structure 106. If the support structure 106 includes traces, the groove 144 is created in the support structure 106 such that it does not interfere with the traces or signals carried by the traces.

Figure 8C:
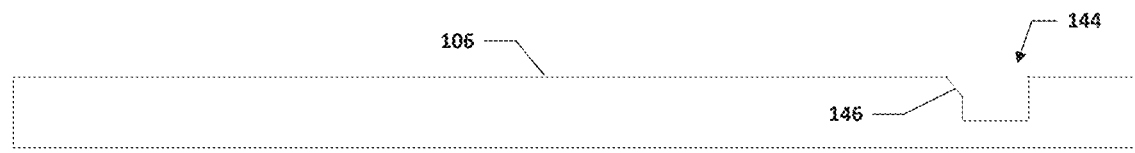

Turning to FIG. 8C, FIG. 8C is a simplified block diagram of the formation of the radiation shield groove 112 in the support structure 106. In an example, after the groove 144 is created in the support structure 106, a chamfer 146 can be created on the side of the radiation shield groove 112 that will be closest to the radiation shield 110 (not shown) when the radiation shield 110 is coupled to the radiation shield groove 112. The chamfer 146 is a sloping edge that helps the groove coupling portion 136 (not shown) of the radiation shield 110 (not shown) couple with the radiation shield groove 112. The chamfer 146 can be created using a router (e.g., a controlled depth router), etching, or some other means that can be used to create the chamfer 146 in the support structure 106.

Figure 8D:
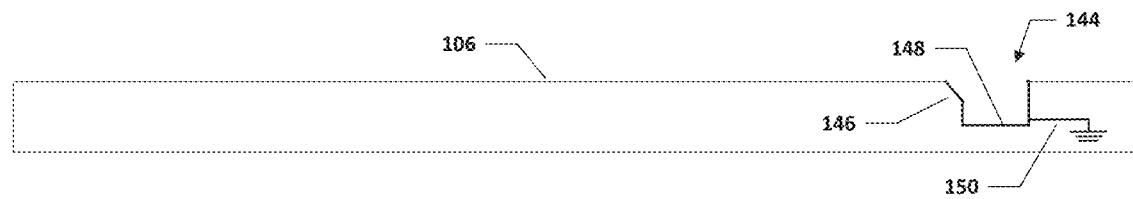

Turning to FIG. 8D, FIG. 8D is a simplified block diagram of the formation of the radiation shield groove 112 in the support structure 106. In an example, after the groove 144 is created in the support structure 106 and the chamfer 146 is added to the groove 144, the groove 144 and the chamfer 146 can be coated with a conductive material 148 (e.g., copper, stainless steel, an alloy such as nickel copper, or some other conductive material) and the conductive material 148 can be coupled to a ground plane 150 to create the radiation shield groove 112. In an example, if the support structure 106 is a PCB, the ground plane 150 can be the ground plane of the PCB.

Figure 9A:
FIGS. 9A-9E are simplified block diagrams illustrating example details of the creation of a radiation shield groove in a portion of a system to enable a radiation shield and a groove in a support structure, in accordance with an embodiment of the present disclosure.

Turning to FIGS. 9A-9E, FIGS. 9A-9E are simplified block diagrams illustrating the formation of the radiation shield groove 112 in layers of the support structure 106. In an example, the support structure 106 can be comprised of layers. For example, support structure layers 152a-152e are illustrated in FIG. 9A. The support structure layers 152a-152e can be pre-fabricated before being stacked together or can be create in a single manufacturing process where one layer is created on top of the other layer. Note that the number and profile of the support structure layers 152a-152e is for illustration purposes only and more or fewer layers may be used with a similar or an entirely different profile.

Figure 9B:
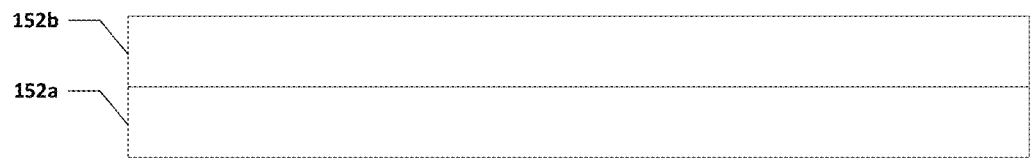
Figure 9C:
Figure 9D:
Figure 9E:
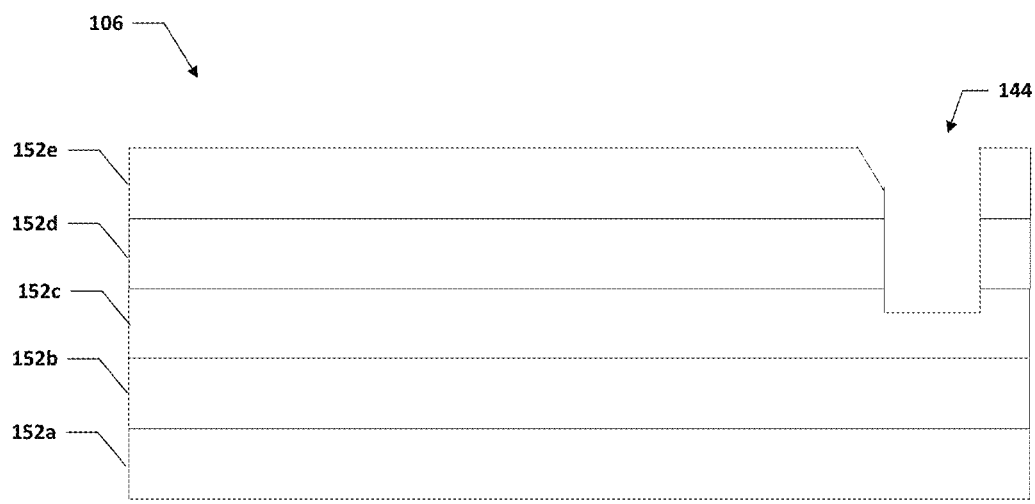

As illustrated in FIG. 9B, support structure layer 152b can be added or created over support structure layer 152a. As illustrated in FIG. 9C, support structure layer 152c can be added or created over support structure layer 152b. In an example, support structure layer 152c can have the beginnings of what will become the radiation shield groove 112. As illustrated in FIG. 9D, support structure layer 152d can be added or created over support structure layer 152c. As illustrated in FIG. 9E, support structure layer 152e can be added or created over support structure layer 152d to create the groove 144 and the chamfer 146 in the support structure 106. After the groove 144 and the chamfer 146 are created in the support structure 106, the groove 144 and the chamfer 146 can be coated with a conductive material 148 and the conductive material 148 can be coupled to a ground plane 150 to create the radiation shield groove 112, as illustrated in FIG. 8D. It should be noted that the layering process illustrated in FIGS. 9A-9E may be difficult due to issues with the precise alignment of each layer, especially if the support structure 106 is a PCB and includes traces Turning to FIGS. 10A-10E, FIGS. 10A-10E are simplified block diagrams illustrating the formation of the radiation shield 110. In an example, the radiation shield 110 can be created from a single piece of material 154. For example, the radiation shield 110 can be created from a sheet or single piece of a conducive material (e.g., stainless steel, copper, an alloy such as nickel copper, or some material that is conductive, rigid, and can help contain or mitigate the radiation from the one or more radiation sources 108 from extending past the radiation shield 110 or at least partially contain or mitigate the radiation from the one or more radiation sources 108 from extending past the radiation shield 110).

Figure 10A:
FIGS. 10A-10E are simplified block diagrams illustrating example details of the creation of a radiation shield to enable a radiation shield and a groove in a support structure, in accordance with an embodiment of the present disclosure.
Figure 10B:

As illustrated in FIG. 10B, the corner notch 142 can be created in the single piece of material 154 to accommodate the bending of the material to create the wall 130 and the groove coupling wall 132. The corner notch 142 can be created by stamping, grinding, routing, or some other means of creating the corner notch 142 in the single piece of material 154. The gap created by the corner notch 142 can be small enough to block or at least substantially block radiation. For example, if the radiation is EMI radiation, once the radiation shield 110 is crated, the corner notch 142 can have a height and width that will block or at least block a majority of the EMI radiation. In an illustrative example, if the radiation is EMI radiation, once the radiation shield 110 is crated, the height of the corner notch 142 can be less than about 2.5 mm and the width of the corner notch 142 can be less than about 2.5 mm to block or at least block a majority of the EMI radiation. In a specific example if the radiation is EMI radiation, once the radiation shield 110 is crated, the corner notch 142 can have a height less than about 2 mm and width less than about 2 mm.

Figure 10C:
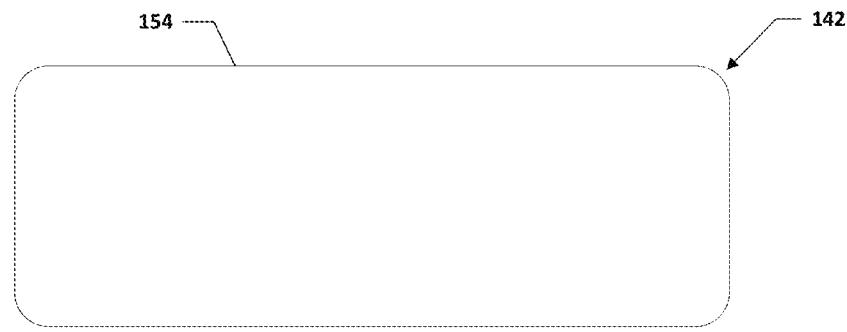
Figure 10D:
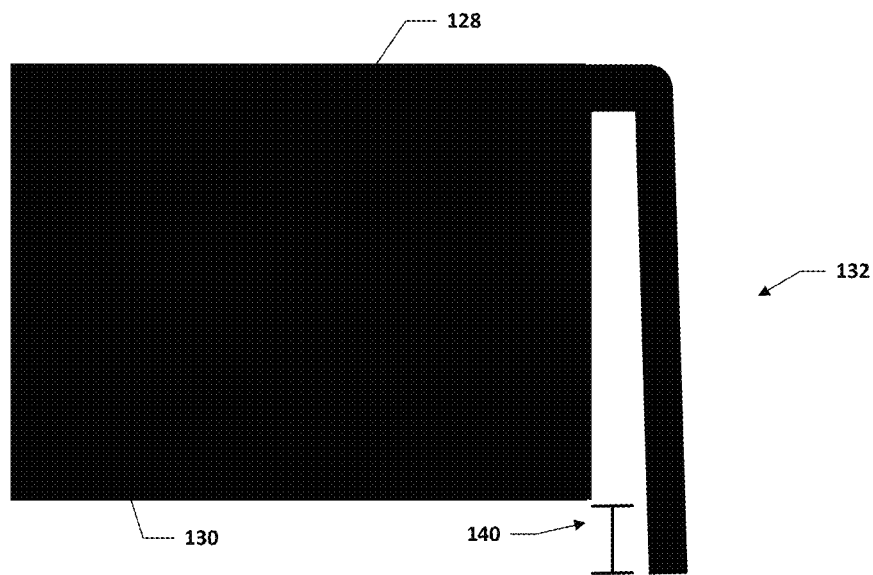
Figure 10E:
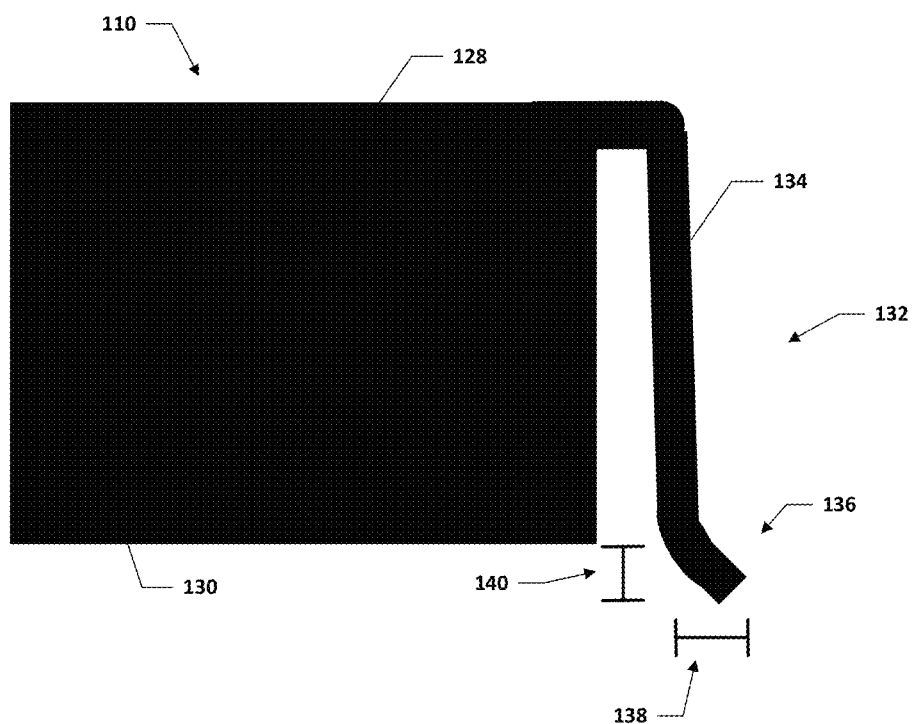

After the corner notch 142 is created in the single piece of material 154, portions of the single piece of material 154 can be bent to create the general shape of the radiation shield 110, as illustrated in the top view illustrated in FIG. 10C. FIG. 10D is a side view of the general shape of the radiation shield 110, illustrated in FIG. 10C. As illustrated in FIG. 10D, the general shape of the radiation shield 110 can include the lid 128, the wall 130, and the groove coupling wall 132. The groove coupling wall 132 can extend past an edge of the wall 130 by the length 140. As illustrated in FIG. 10E, a bottom portion of the groove coupling wall 132 can be bent to create the wall portion 134 and the groove coupling portion 136 of the groove coupling wall 132. The width 138 of the groove coupling portion 136 depends on the groove width 126 illustrated in FIG. 4 and, as explained with reference to FIG. 7, the distance needed to help the radiation shield 110 coupled with the radiation shield groove 112 (illustrated in FIG. 4).

Figure 11:
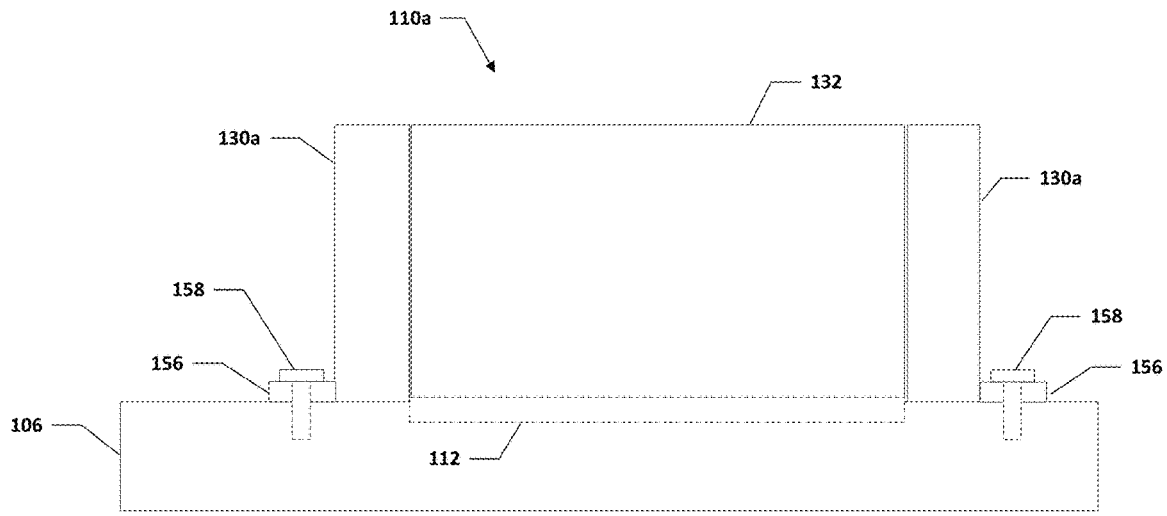
FIG. 11 is a simplified block diagram of a portion of a system to enable a radiation shield and a groove in a support structure, in accordance with an embodiment of the present disclosure.

Turning to FIG. 11, FIG. 11 is a simplified block diagram illustrating a radiation shield 110a being coupled to the support structure 106. In an example, the radiation shield 110a can include a wall 130a, and the groove coupling wall 132. The groove coupling wall 132 can be coupled to the radiation shield groove 112 in the support structure 106. The The wall 130a can include one or more support structure securing brackets 156 that extend perpendicularly from the wall 130a. In an example, for each of the support structure securing brackets 156, a support structure securing fastener 158 can extend through the support structure securing brackets 156 and into the support structure 106 to help secure the radiation shield 110a to the support structure 106 and provide stability for the radiation shield 110a along the X plane, the Y plane, and the Z plane. In a specific example, the support structure securing fastener 158 is a screw or some other type of removable fastener that can removably secure the radiation shield 110a to the support structure 106. In other examples, the support structure securing fastener 158 is a rivet or some other type of fastener that can secure the radiation shield 110a to the support structure 106 but is not as easily removable as a screw or some other type of removable fastener.

Figure 12:
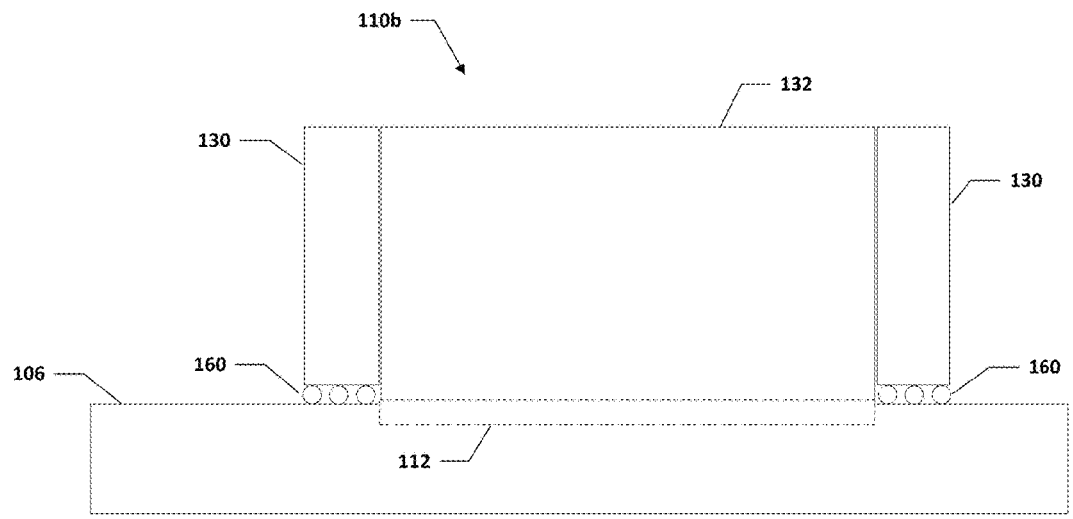
FIG. 12 is a simplified block diagram of a portion of a system to enable a radiation shield and a groove in a support structure, in accordance with an embodiment of the present disclosure.

Turning to FIG. 12, FIG. 12 is a simplified block diagram illustrating a radiation shield 110b being coupled to the support structure 106. In an example, the radiation shield 110b can include the wall 130, and the groove coupling wall 132. The groove coupling wall 132 can be coupled to the radiation shield groove 112 in the support structure 106. The The wall 130 can be coupled to the support structure 106 using a securing fastener 160 to help secure the radiation shield 110b to the support structure 106 and provide stability for the radiation shield 110a along the X plane, the Y plane, and the Z plane. The securing fastener 160 can be a semi-permanent or permanent fastener that does not allow the radiation shield 110b to be relatively easily removed as compared to the support structure securing fastener 158 described with reference to FIG. 11. In a specific example, the securing fastener 160 can be solder, adhesive, tape, a weld, or some other type of fastener or coupling means that secures the wall 130 to the support structure 106.

Figure 13:
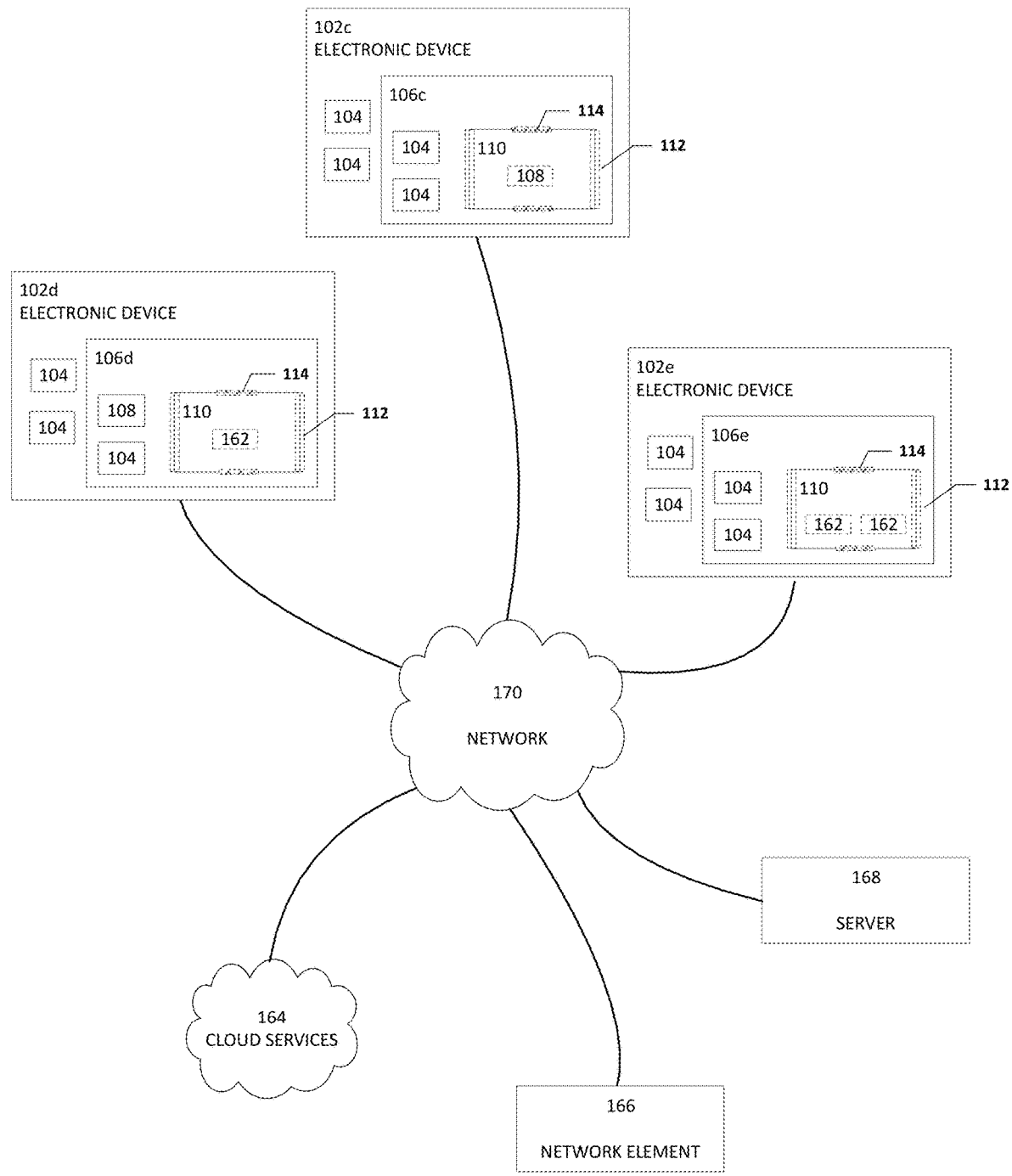
FIG. 13 is a block diagram illustrating example devices that include a radiation shield and a groove in a support structure, in accordance with an embodiment of the present disclosure.

Turning to FIG. 13, FIG. 13 is a simplified block diagram of an electronic device configured with a radiation shield and a groove in a support structure, in accordance with an embodiment of the present disclosure. For example, as illustrated in FIG. 13, an electronic device 102c includes the one or more electronics 104 and a support structure 106c. The support structure 106c can include at least one of the one or more electronics 104, the one or more radiation sources 108, the radiation shield 110, the one or more radiation shield grooves 112, and the one or more clips 114.

In an example, the support structure 106c can be a substrate and more particularly, a printed circuit board (PCB). The one or more radiation sources 108 can be on or over the support structure 106c and the radiation shield 110 can be over the one or more radiation sources 108. At least one edge of the radiation shield 110 can extend into the radiation shield groove 112 in the support structure 106c and help couple the radiation shield 110 to the radiation shield groove 112. The radiation shield groove 112 can be coupled to a ground plane (not shown) and can help ground the radiation shield 110 when the radiation shield 110 is coupled to the radiation shield groove 112. In addition, when the radiation shield 110 is coupled to the radiation shield groove 112, the radiation shield groove 112 can help support and stabilize the radiation shield 110 in the X plane and the Y plane. Further, at least one edge of the radiation shield 110 can be coupled to the one or more clips 114. The one or more clips 114 can help support and stabilize the radiation shield 110 in the Z plane and in the Y plane (or the X plane depending on the orientation of the radiation shield 110 and the one or more clips 114). In other examples, instead of the one or more clips 114, the radiation shield 110 can be coupled to the support structure 106c using the support structure securing brackets 156 and the support structure securing fastener 158 (as illustrated in FIG. 11), the securing fastener 160 (as illustrated in FIG. 12), or some other means to secure the radiation shield 110 to the support structure 106c. The radiation shield 110 can be over the radiation source 108 to help contain or mitigate the radiation from the radiation source 108 from extending past the radiation shield 110 or at least partially contain or mitigate the radiation from the radiation source 108 from extending past the radiation shield 110.

In addition, an electronic device 102d can include one or more electronics 104 and a support structure 106d. The support structure 106d can include at least one of the one or more electronics 104, the one or more radiation sources 108, the radiation shield 110, the one or more radiation shield grooves 112, the one or more clips 114 and one or more radiation sensitive devices 162. In an example, the support structure 106d can be a substrate and more particularly, a printed circuit board (PCB).

The radiation shield 110 can be over the one or more radiation sensitive devices 162. At least one edge of the radiation shield 110 can extend into the radiation shield groove 112 in the support structure 106d and help couple the radiation shield 110 to the radiation shield groove 112. The radiation shield groove 112 can be coupled to a ground plane (not shown) and can help ground the radiation shield 110 when the radiation shield 110 is coupled to the radiation shield groove 112. In addition, when the radiation shield 110 is coupled to the radiation shield groove 112, the radiation shield groove 112 can help support and stabilize the radiation shield 110 in the X plane and the Y plane. Further, at least one edge of the radiation shield 110 can be coupled to the one or more clips 114. The one or more clips 114 can help support and stabilize the radiation shield 110 in the Z plane and in the Y plane (or the X plane depending on the orientation of the radiation shield 110 and the one or more clips 114). In other examples, instead of the one or more clips 114, the radiation shield 110 can be coupled to the support structure 106d using the support structure securing brackets 156 and the support structure securing fastener 158 (as illustrated in FIG. 11), the securing fastener 160 (as illustrated in FIG. 12), or some other means to secure the radiation shield 110 to the support structure 106d. The radiation shield 110 can be over the one or more radiation sensitive devices 162 to help shield the one or more radiation sensitive devices 162 from the radiation from the one or more radiation sources 108 or mitigate the effects of the radiation from the one or more radiation sources 108 from effecting the one or more radiation sensitive devices 162 or at least partially mitigate the effects of the radiation from the one or more radiation sources 108 on the one or more radiation sensitive devices 162.

Also, an electronic device 102e includes one or more electronics 104 and a support structure 106e. The support structure 106e can include at least one of the one or more electronics 104, the radiation shield 110, the one or more radiation shield grooves 112, the one or more clips 114, and the one or more radiation sensitive devices 162. In an example, the support structure 106e can be a substrate and more particularly, a printed circuit board (PCB).

The radiation shield 110 can be over the one or more radiation sensitive devices 162. At least one edge of the radiation shield 110 can extend into the radiation shield groove 112 in the support structure 106e and help couple the radiation shield 110 to the radiation shield groove 112. The radiation shield groove 112 can be coupled to a ground plane (not shown) and can help ground the radiation shield 110 when the radiation shield 110 is coupled to the radiation shield groove 112. In addition, when the radiation shield 110 is coupled to the radiation shield groove 112, the radiation shield groove 112 can help support and stabilize the radiation shield 110 in the X plane and the Y plane. Further, at least one edge of the radiation shield 110 can be coupled to the one or more clips 114. The one or more clips 114 can help support and stabilize the radiation shield 110 in the Z plane and in the Y plane (or the X plane depending on the orientation of the radiation shield 110 and the one or more clips 114). In other examples, instead of the one or more clips 114, the radiation shield 110 can be coupled to the support structure 106e using the support structure securing brackets 156 and the support structure securing fastener 158 (as illustrated in FIG. 11), the securing fastener 160 (as illustrated in FIG. 12), or some other means to secure the radiation shield 110 to the support structure 106e. The radiation shield 110 can be over the one or more radiation sensitive devices 162 to help shield the one or more radiation sensitive devices 162 from the radiation from outside of the electronic device 102e or mitigate the effects of the radiation from outside of the electronic device 102e from effecting the one or more radiation sensitive devices 162 or at least partially mitigate the effects of the radiation from outside of the electronic device 102e on the one or more radiation sensitive devices 162.

Each of electronic devices 102a-102d may be in communication with each other, cloud services 164, network element 166, and/or server 168 using network 170. In some examples, one or more of electronic devices 102a-102d may be standalone devices and not connected to network 170 or another device.

Elements of FIG. 13 may be coupled to one another through one or more interfaces employing any suitable connections (wired or wireless), which provide viable pathways for network (e.g., network 170, etc.) communications. Additionally, any one or more of these elements of FIG. 13 may be combined or removed from the architecture based on particular configuration needs. Network 170 may include a configuration capable of transmission control protocol/Internet protocol (TCP/IP) communications for the transmission or reception of packets in a network. Each of electronic devices 102a-102d may also operate in conjunction with a user datagram protocol/IP (UDP/IP) or any other suitable protocol where appropriate and based on particular needs.

Turning to the network infrastructure of FIG. 13, network 170 represents a series of points or nodes of interconnected communication paths for receiving and transmitting packets of information. Network 170 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 170, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102a-102d are meant to encompass a computer, a personal digital assistant (PDA), a laptop or electronic notebook, a cellular telephone, a smartphone, an IP phone, network elements, network appliances, servers, routers, switches, gateways, bridges, load balancers, processors, modules, or any other device, component, element, or object that includes a radiation source and/or a radiation sensitive device. Each of electronic devices 102a-102d may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102a-102d may include virtual elements.

In regards to the internal structure, each of electronic devices 102a-102d can include memory elements for storing information to be used in operations. Each of electronic devices 102a-102d may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

Additionally, each of electronic devices 102a-102d can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Note that with the examples provided herein, interaction may be described in terms of one, two, three, or more elements. However, this has been done for purposes of clarity and example only. In certain cases, it may be easier to describe one or more of the functionalities by only referencing a limited number of elements. It should be appreciated that electronic devices 102a-102d and their teachings are readily scalable and can accommodate a large number of components, as well as more complicated/sophisticated arrangements and configurations. Accordingly, the examples provided should not limit the scope or inhibit the broad teachings of electronic devices 102a-102d and as potentially applied to a myriad of other architectures.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102a-102d have been illustrated with reference to particular elements and operations, these elements and operations may be replaced by any suitable architecture, protocols, and/or processes that achieve the intended functionality of electronic devices 102a-102d.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, is an electronic device including a support structure that includes a radiation shield groove that extends past a surface of the support structure and into the support structure, a radiation source on the support structure, and a radiation shield around the radiation source. The radiation shield includes a wall secured to the support structure and a groove channel coupling wall that extends past the surface of the support structure and into the radiation shield groove.

In Example A2, the subject matter of Example A1 can optionally include a second wall secured to the support structure, where the second wall is opposite the wall and a second groove channel coupling wall that extends past a surface of the support structure and into a second radiation shield groove, where the second groove channel coupling wall is opposite the groove channel coupling wall.

In Example A3, the subject matter of any one of Examples A1-A2 can optionally include where the radiation shield groove is coupled to a ground plane.

In Example A4, the subject matter of any one of Examples A1-A3 can optionally include where the radiation shield groove extends at least four (4) mm into the support structure.

In Example A5, the subject matter of any one of Examples A1-A4 can optionally include where the wall is secured to the support structure using one clip.

In Example A6, the subject matter of any one of Examples A1-A5 can optionally include where the wall is secured to the support structure using two clips.

In Example A7, the subject matter of any one of Examples A1-A6 can optionally include where an end of groove channel coupling wall is angled.

In Example A8, the subject matter of any one of Examples A1-A7 can optionally include where the radiation shield mitigates effects of at least a portion of electromagnetic interference (EMI) and/or radio-frequency interference (RFI) emitted from the radiation source.

In Example A9, the subject matter of any one of Examples A1-A8 can optionally include where the support structure is a printed circuit board.

Example AA1 is a radiation shield including a first wall that is secured to a surface of a support structure, a second wall, opposite the first wall, that is secured to the surface of the support structure, a first groove channel coupling wall that extends past the surface of the support structure and into a first radiation shield groove, and a second groove channel coupling wall, opposite the first groove channel coupling wall, that extends past the surface of the support structure and into a second radiation shield groove.

In Example AA2, the subject matter of Example AA1 can optionally include where the first groove channel coupling wall extends at least four (4) mm past the surface of the support structure and into the first radiation shield groove.

In Example AA3, the subject matter of any one of Examples AA1-AA2 can optionally include where the first wall is secured to the support structure using a first clip and the second wall is secured to the support structure using a second clip.

In Example AA4, the subject matter of any one of Examples AA1-AA3 can optionally include where the support structure is a printed circuit board.

In Example AA5, the subject matter of any one of Examples AA1-AA4 can optionally include where the first wall, the second wall, the first groove channel coupling wall, and the second groove channel coupling wall define an interior space of the radiation shield that houses a radiation source that emits electromagnetic interference (EMI) and/or radio-frequency interference (RFI).

In Example AA6, the subject matter of any one of Examples AA1-AA5 can optionally include where the first wall, the second wall, the first groove channel coupling wall, and the second groove channel coupling wall define an interior space of the radiation shield that houses a radiation sensitive device that is affected by electromagnetic interference (EMI) and/or radio-frequency interference (RFI).

Example M1 is a method including identifying a radiation source on a printed circuit board, creating a first radiation shield groove in a surface of the printed circuit board, creating a second radiation shield groove in the surface of the printed circuit board, and creating a radiation shield to mitigate radiation effects from the radiation source. The radiation shield can include a first wall that is secured to the surface of the printed circuit board, a second wall, opposite the first wall, that is secured to the surface of the printed circuit board, a first groove channel coupling wall that extends past the surface of the printed circuit board and into the first radiation shield groove, and a second groove channel coupling wall, opposite the first groove channel coupling wall, that extends past the surface of the printed circuit board and into the second radiation shield groove.

In Example M2, the subject matter of Example M1 can optionally include where the first wall, the second wall, the first groove channel coupling wall, and the second groove channel coupling wall define an interior space of the radiation shield that houses the radiation source.

In Example M3, the subject matter of any one of the Examples M1-M2 can optionally include where the first radiation shield groove extends into the printed circuit board at least four (4) millimeters from the surface of the printed circuit board.

In Example M4, the subject matter of any one of the Examples M1-M3 can optionally include where the first wall is secured to the printed circuit board using a first clip and the second wall is secured to the printed circuit board using a second clip.

In Example M5, the subject matter of any one of the Examples M1-M4 can optionally include where the first radiation shield groove is coupled to a ground plane.

What is claimed is:

1. An electronic device comprising:
a support structure that includes a radiation shield groove that extends past a surface of the support structure and into the support structure;
a radiation source disposed on the support structure; and
a radiation shield surrounding the radiation source, wherein the radiation shield includes a wall secured to the support structure and a groove channel coupling wall that extends past the surface of the support structure and into the radiation shield groove,
wherein the groove channel coupling wall includes a groove coupling portion at its distal end angled outwardly from the radiation shield, and an angled configuration directing the groove channel coupling wall away from the radiation shield such that, when the groove coupling portion is engaged within the radiation shield groove, the groove channel coupling wall is biased towards the radiation shield, creating a force that presses the groove coupling portion against an outer edge of the radiation shield groove to secure the radiation shield in a fixed plane relative to the support structure.

2. The electronic device of claim 1, wherein the radiation shield further includes:
a second wall secured to the support structure, wherein the second wall is opposite the wall; and
a second groove channel coupling wall that extends past a surface of the support structure and into a second radiation shield groove, wherein the second groove channel coupling wall is opposite the groove channel coupling wall.

3. The electronic device of claim 1, wherein the radiation shield groove is coupled to a ground plane.

4. The electronic device of claim 1, wherein the radiation shield groove extends at least 4 mm into the support structure.

5. The electronic device of claim 1, wherein the wall is secured to the support structure using one clip.

6. The electronic device of claim 1, wherein the wall is secured to the support structure using two clips.

7. The electronic device of claim 1, wherein the radiation shield mitigates effects of at least a portion of electromagnetic interference (EMI) and/or radio-frequency interference (RFI) emitted from the radiation source.

8. The electronic device of claim 1, wherein the support structure is a printed circuit board.

9. A radiation shield comprising:
a first wall that is secured to a surface of a support structure;
a second wall, opposite the first wall, that is secured to the surface of the support structure;
a first groove channel coupling wall that extends past the surface of the support structure and into a first radiation shield groove; and
a second groove channel coupling wall, opposite the first groove channel coupling wall, that extends past the surface of the support structure and into a second radiation shield groove,
wherein each of the first and second groove channel coupling walls includes a groove coupling portion at its distal end angled outwardly, and an angled configuration directing the respective groove channel coupling wall outwardly such that, when the groove coupling portion is engaged within the respective radiation shield groove, the respective groove channel coupling wall is biased inwardly, creating a force that presses the groove coupling portion against an outer edge of the respective radiation shield groove to secure the radiation shield in a fixed plane relative to the support structure.

10. The radiation shield of claim 9, wherein the first groove channel coupling wall extends at least 4 mm past the surface of the support structure and into the first radiation shield groove.

11. The radiation shield of claim 9, wherein the first wall is secured to the support structure using a first clip and the second wall is secured to the support structure using a second clip.

12. The radiation shield of claim 9, wherein the support structure is a printed circuit board.

13. The radiation shield of claim 9, wherein the first wall, the second wall, the first groove channel coupling wall, and the second groove channel coupling wall define an interior space of the radiation shield that houses a radiation source that emits electromagnetic interference (EMI) and/or radio-frequency interference (RFI).

14. The radiation shield of claim 12, wherein the first wall, the second wall, the first groove channel coupling wall, and the second groove channel coupling wall define an interior space of the radiation shield that houses a radiation sensitive device that is affected by electromagnetic interference (EMI) and/or radio-frequency interference (RFI).

15. A method comprising:
identifying a radiation source on a printed circuit board;
creating a first radiation shield groove in a surface of the printed circuit board;
creating a second radiation shield groove in the surface of the printed circuit board; and
creating a radiation shield to mitigate radiation effects from the radiation source, wherein the radiation shield includes:
a first wall that is secured to the surface of the printed circuit board;
a second wall, opposite the first wall, that is secured to the surface of the printed circuit board;
a first groove channel coupling wall that extends past the surface of the printed circuit board and into the first radiation shield groove; and
a second groove channel coupling wall, opposite the first groove channel coupling wall, that extends past the surface of the printed circuit board and into the second radiation shield groove,
wherein each of the first and second groove channel coupling walls includes a groove coupling portion at its distal end angled outwardly, and an angled configuration directing the respective groove channel coupling wall away from the radiation shield such that, when the groove coupling portion is engaged within the respective radiation shield groove, the respective groove channel coupling wall is biased towards the radiation shield, creating a force that presses the groove coupling portion against an outer edge of the respective radiation shield groove to secure the radiation shield in a fixed plane relative to the support structure.

16. The method of claim 15, wherein the first wall, the second wall, the first groove channel coupling wall, and the second groove channel coupling wall define an interior space of the radiation shield that houses the radiation source.

17. The method of claim 15, wherein the first radiation shield groove extends into the printed circuit board at least four (4) millimeters from the surface of the printed circuit board.

18. The method of claim 17, wherein the first wall is secured to the printed circuit board using a first clip and the second wall is secured to the printed circuit board using a second clip.

19. The method of claim 18, wherein the first radiation shield groove is coupled to a ground plane.

\* \* \* \* \*